(12) United States Patent
Low et al.

(10) Patent No.: US 6,798,035 B1
(45) Date of Patent: Sep. 28, 2004

(54) BONDING PAD FOR LOW K DIELECTRIC

(75) Inventors: Qwai H. Low, Cupertino, CA (US); Ramaswamy Ranganathan, Saratoga, CA (US); Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/600,255

(22) Filed: Jun. 20, 2003

(51) Int. Cl.[7] ............................................. H01L 31/00
(52) U.S. Cl. ............................. 257/459; 257/786
(58) Field of Search ........................... 257/459, 748, 257/779–781, 784, 786

(56) References Cited

U.S. PATENT DOCUMENTS 6,388,331 B1 * 5/2002 Bond et al. ................. 257/773
6,625,882 B1 * 9/2003 Saran et al. ................. 29/843

* cited by examiner

Primary Examiner—Thien F Tran
(74) Attorney, Agent, or Firm—Luedeka, Neely & Graham

(57) ABSTRACT

A bonding pad structure having an electrically conductive capping layer. An electrically conductive first supporting layer is disposed immediately under the electrically conductive capping layer, without any intervening layers between the electrically conductive capping layer and the electrically conductive first supporting layer. The electrically conductive first supporting layer is configured as one of a sheet having no voids and a sheet having slotted voids in a first direction. An electrically conductive second supporting layer is disposed under the electrically conductive first supporting layer. The electrically conductive second supporting layer is configured as one of a sheet having slotted voids in the first direction, a sheet having slotted voids in a second direction, and a sheet having checkerboard voids.

20 Claims, 2 Drawing Sheets

BONDING PAD FOR LOW K DIELECTRIC

FIELD

This invention relates to the field of integrated circuit fabrication. More particularly, this invention relates to new structures and fabrication methods for integrated circuits that use advanced materials.

BACKGROUND

As integrated circuits have become increasingly smaller, electrically conductive structures within the integrated circuits are placed increasingly closer together. This situation tends to enhance the inherent problem of parasitic capacitance between adjacent electrically conductive structures. Thus, new electrically insulating materials have been devised for use between electrically conductive structures, to reduce such capacitance problems. The new electrically insulating materials typically have lower dielectric constants, and thus are generally referred to as low k materials. While low k materials help to resolve the capacitance problems described above, they unfortunately tend to introduce new challenges.

Low k materials are typically filled with small voids that help reduce the material's effective dielectric constant. Thus, there is less of the material itself within a given volume, which tends to reduce the structural strength of the material. The resulting porous and brittle nature of such low k materials presents new challenges in both the fabrication and packaging processes. Unless special precautions are taken, the robustness and reliability of an integrated circuit that is fabricated with low k materials may be reduced from that of an integrated circuit that is fabricated with traditional materials, because low k materials differ from traditional materials in properties such as thermal coefficient of expansion, moisture absorption, adhesion to adjacent layers, mechanical strength, and thermal conductivity.

Concerning the problem of thermal coefficient of expansion, when adjacent layers having different thermal coefficients of expansion are heated and cooled, such as occurs during the normal operation of an integrated circuit, the layers tend to expand and contract at different rates and to different degrees. These forces induce strains in the adjacent and proximal layers. Low k materials tend to have thermal coefficients of expansion that are sufficiently different from those of the other materials used to fabricate integrated circuits that such strains create problems, which may be both physical and electrical, in the integrated circuit.

As to the problem of moisture absorption, the porosity of low k materials makes them susceptible to absorbing the moisture that typically tends to diffuse into the packaged integrated circuit. As the low k material absorbs such moisture, the properties of the low k material changes. For example, the dielectric constant of the material changes, because the voids tend to fill with water or water vapor. The moisture in the voids may rapidly expand during subsequent heating operations such as baking or solder ball reflow, causing the layers of the integrated circuit to burst apart, resulting in dramatic device failure. The moisture absorbed by the low k material also tends to cause other problems, some of which are described in more detail below.

Integrated circuits containing low k materials are inherently more prone to delamination, either between the various layers of the integrated circuit itself, or between the integrated circuit and packaging materials, such as underfill and mold compound, or other materials which are in intimate contact with the integrated circuit. There are several probable causes for such delamination, including a reduction in the adhesion of a low k layer due to absorption of moisture, as described above. In addition, because the low k material tends to be very porous by nature, there is physically less material available to form adhesive bonds with adjacent layers. Further, the strains induced by differing thermal coefficients of expansion also tend to shear the low k layer from adjacent layers, which again tends to enhance the occurrence of delamination.

As to mechanical strength, low k materials are typically more brittle and have a lower breaking point than other materials. One reason for this is, again, the porosity of the low k material, where a significant percentage of its physical volume is filled with voids. Thus, integrated circuits containing low k materials are inherently more prone to breaking or cracking during processes where physical contact is made with the integrated circuit surface, such as wire bonding and electrical probing, or processes that cause bending stresses such as mold curing, underfill curing, solder ball reflow, or temperature cycling.

Finally, because of their porosity and other properties, low k materials tend to be very poor thermal conductors, typically much less than half a watt per meter-Kelvin (W/mK). This contrasts significantly with the thermal conductivity of traditional integrated circuit and packaging materials such as silicon (60–90 W/mK), copper (380–390 W/mK), mold compound (0.7–2 W/mK), or die attach material (2–4 W/mK). Thus, the thermal energy created during the normal operation of the integrated circuit tends to not be dissipated well by low k materials. Therefore, thermal energy tends to build up within the integrated circuit, and is expressed as localized areas of increased temperature, or hot spots.

One example of where the structural weakness of low k materials has been especially detrimental is when they are used as dielectrics under bonding pad structures. When a wire bonding operation is performed, a relatively high degree of force is applied to the bonding pad, which force tends to be transferred down through the bonding pad structure and into underlying structures. When the bonding pad overlies electrical structures, such as input/output cells, the low k materials used for the dielectric layers in such electrical structures tend to crack or delaminate from adjacent layers under the load of the transferred force. This problem could be resolved by moving the input/output cells out from under the bonding pads, but this would tend to increase the size of the integrated circuit, which not desirable.

There is a need, therefore, for new structures, processes, and materials for use in integrated circuit fabrication, which help to alleviate one or more of the challenges that are enhanced by the use of low k materials.

SUMMARY

The above and other needs are met by a bonding pad structure having an electrically conductive capping layer. An electrically conductive first supporting layer is disposed immediately under the electrically conductive capping layer, without any intervening layers between the electrically conductive capping layer and the electrically conductive first supporting layer. The electrically conductive first supporting layer is configured as one of a sheet having no voids and a sheet having slotted voids in a first direction. An electrically conductive second supporting layer is disposed under the electrically conductive first supporting layer. The electrically conductive second supporting layer is configured as one of a sheet having slotted voids in the first direction, a sheet having slotted voids in a second direction, and a sheet having checkerboard voids.

In this manner, the first and second supporting layers provide structural support for the layers below the bonding pad structure, such as electrical circuitry like input/output cells. With the supporting layers configured as described herein, pressure that is applied to the bonding pad structure, such as during a wire bonding operation, is absorbed or redirected so that the more delicate structures underneath, including low k dielectric layers, are protected from the force applied during the bonding operation. In this manner, the delicate underlying structures do not suffer physical damage, such as cracks and delamination.

In various preferred embodiments, the bonding pad structure includes an electrically nonconductive layer disposed between the electrically conductive first supporting layer and the electrically conductive second supporting layer. The electrically nonconductive layer is preferably either a low k layer or a silicon oxide layer. Preferably, the electrically conductive capping layer is formed of aluminum. The electrically conductive first supporting layer is preferably formed of copper. The electrically conductive first supporting layer preferably has a thickness of no less than about one micron. Preferably, the electrically conductive second supporting layer is formed of copper. In a preferred embodiment, the first direction is perpendicular to the second direction.

The configuration of the electrically conductive first supporting layer and the electrically conductive second supporting layer has many different combinations. In a first embodiment, the electrically conductive first supporting layer is configured as a sheet having no voids, and the electrically conductive second supporting layer is configured as a sheet having slotted voids in the first direction. In a second embodiment, the electrically conductive first supporting layer is configured as a sheet having no voids, and the electrically conductive second supporting layer is configured as a sheet having slotted voids in a second direction. In a third embodiment, the electrically conductive first supporting layer is configured as a sheet having no voids, and the electrically conductive second supporting layer is configured as a sheet having checkerboard voids.

In a fourth embodiment, the electrically conductive first supporting layer is configured as a sheet having slotted voids in a first direction, and the electrically conductive second supporting layer is configured as a sheet having slotted voids in the first direction. In a fifth embodiment, the electrically conductive first supporting layer is configured as a sheet having slotted voids in a first direction, and the electrically conductive second supporting layer is configured as a sheet having slotted voids in a second direction. In a sixth embodiment, the electrically conductive first supporting layer is configured as a sheet having slotted voids in a first direction, and the electrically conductive second supporting layer is configured as a sheet having checkerboard voids.

Also described is an integrated circuit having the bonding pad structure described herein, and an input/output cell disposed directly underneath and electrically connected to the bonding pad structure. In another embodiment, electrically conductive third layers are disposed under the electrically conductive second supporting layer, and low k layers electrically insulate the electrically conductive third layers from one another and from the electrically conductive second supporting layer.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
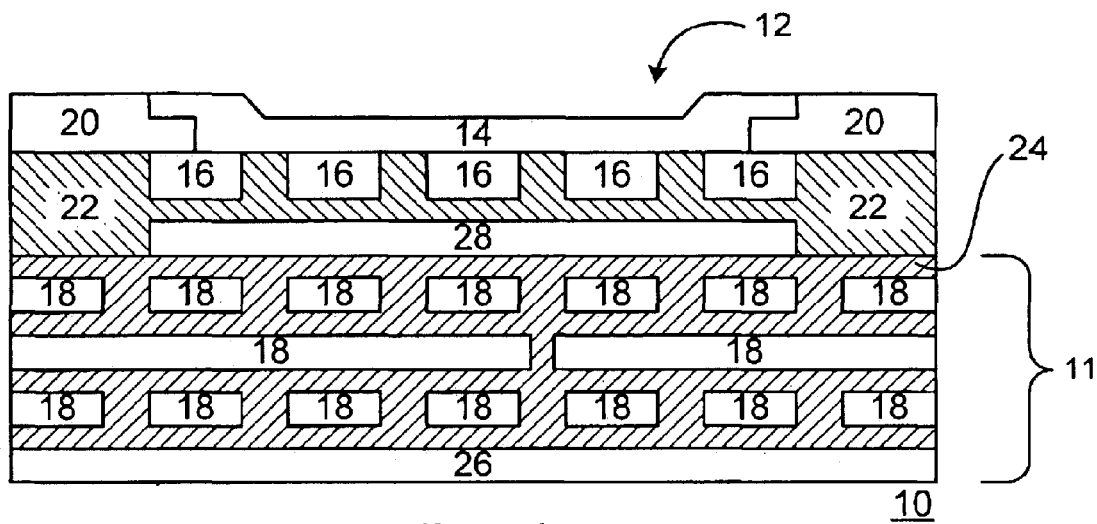
FIG. 1 is a cross sectional view of a portion of an integrated circuit, depicting a bonding pad structure according to the present invention, which overlies additional electrical circuitry.

With reference now to FIG. 1, there is shown a cross sectional view of a portion of an integrated circuit 10, depicting a bonding pad structure 12 according to the present invention, which overlies additional electrical circuitry 11. The structures as depicted are preferably formed on a substrate 26. The substrate 26 most preferably includes a semiconductor wafer, such as one formed of one or more of silicon, germanium, or a III–V compound such as gallium arsenide. The substrate 26 may also include additional layers and structures, which are not individually depicted in FIG. 1 so as to not unnecessarily encumber the drawing with the details of elements that are not essential for an understanding of the invention.

The bonding pad structure 12 preferably includes a capping layer 14, which is formed of an electrically conductive material such as a metal or a metal alloy, and which is most preferably aluminum. An electrically nonconducting layer, such as a passivation layer 20, preferably surrounds the electrically conductive capping layer 14. The capping layer 14 is that part of the bonding pad structure 12 to which a wire is bonded during a wire bonding operation, so as to make an electrical connection with the integrated circuit 10.

A first electrically conductive supporting layer 16 is disposed immediately below the capping layer 14, without any intervening layers between the capping layer 14 and the first supporting layer 16. The first supporting layer 16 is also preferably formed of a metal or a metal alloy, and is most preferably formed of copper. The first supporting layer 16 is preferably formed to have a thickness that is no less than about one micron, and is most preferably formed to have a thickness that is not less than about ninety-six hundred angstroms.

In this manner, the first supporting layer 16 is formed of a material and with a thickness that are sufficient to substantially absorb the forces applied to the bonding pad structure 12 during a wire bonding operation, and protect the underlying circuitry from such forces, in a manner as more fully described hereafter.

Figure 2:
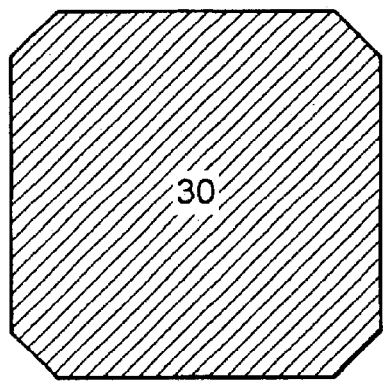
FIG. 2 is a top plan view of a solid sheet, as a configuration for an electrically conductive structure.
Figure 3:
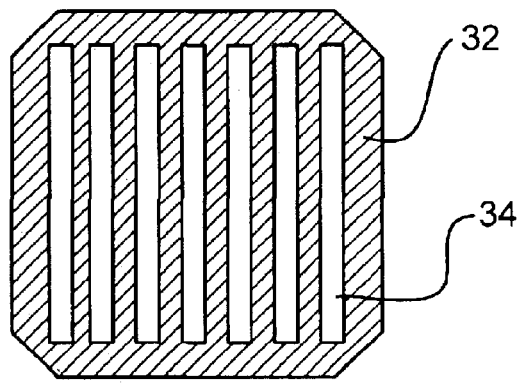
FIG. 3 is a top plan view of a sheet having slotted voids in a first direction, as a configuration for an electrically conductive structure.

The first supporting layer 16 is preferably configured as either a solid sheet 30 without any voids, as depicted in FIG. 2, or as a sheet 32 having slotted voids 34 oriented in a first direction, as depicted in FIG. 3. It is appreciated that there term "voids" as used herein refers to relatively large, intentionally made voids, and does not refer to very small pinholes or other such voids that may incidentally form in the material of the relevant layer as it is being fabricated.

Figure 4:
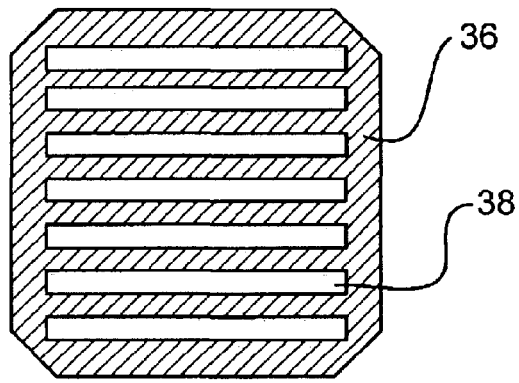
FIG. 4 is a top plan view of a sheet having slotted voids in a second direction, as a configuration for an electrically conductive structure.
Figure 5:
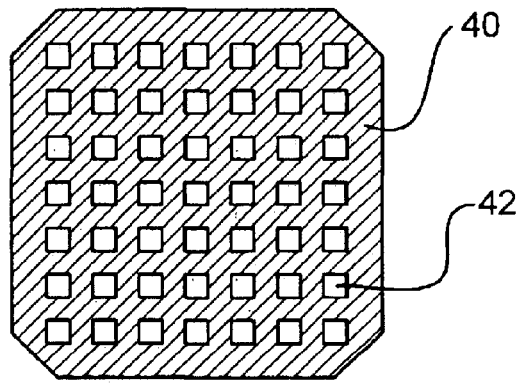
FIG. 5 is a top plan view of a sheet having checkerboard voids, as a configuration for an electrically conductive structure.
Figure 6:
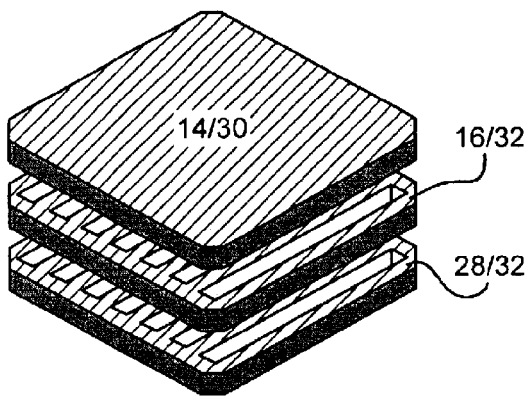
FIG. 6 is a partial exploded perspective view of a first embodiment of the bonding pad structure, depicting an electrically conductive first supporting layer configured as a sheet having slotted voids in a first direction, and an electrically conductive second supporting layer configured as a sheet having slotted voids in a first direction.
Figure 7:
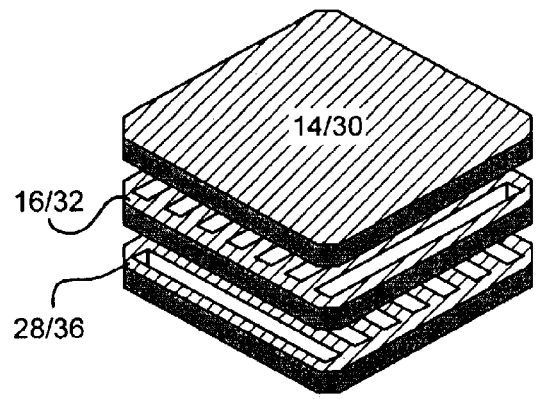
FIG. 7 is a partial exploded perspective view of a first embodiment of the bonding pad structure, depicting an electrically conductive first supporting layer configured as a sheet having slotted voids in a first direction, and an electrically conductive second supporting layer configured as a sheet having slotted voids in a second direction.
Figure 8:
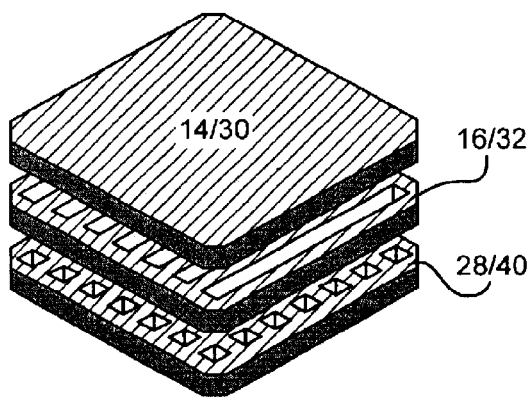
FIG. 8 is a partial exploded perspective view of a first embodiment of the bonding pad structure, depicting an electrically conductive first supporting layer configured as a sheet having slotted voids in a first direction, and an electrically conductive second supporting layer configured as a sheet having voids in a checkerboard pattern.
Figure 9:
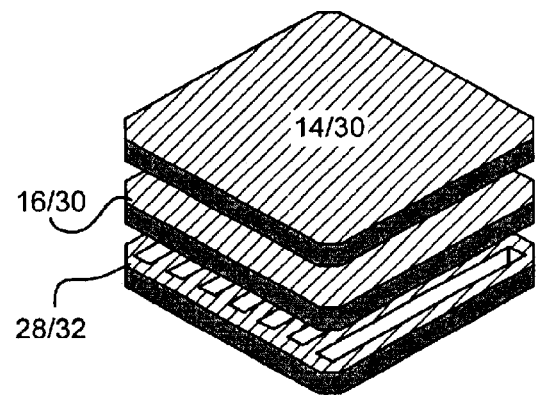
FIG. 9 is a partial exploded perspective view of a first embodiment of the bonding pad structure, depicting an electrically conductive first supporting layer configured as a sheet having slotted no voids, and an electrically conductive second supporting layer configured as a sheet having slotted voids in a first direction.
Figure 10:
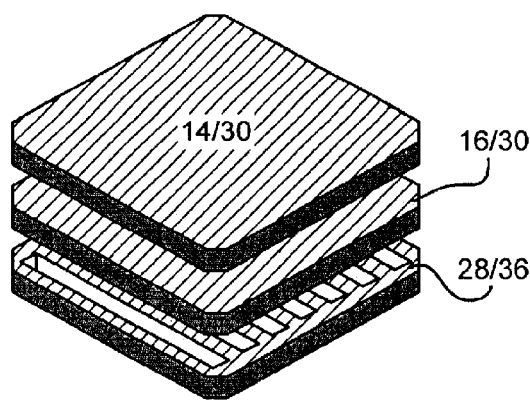
FIG. 10 is a partial exploded perspective view of a first embodiment of the bonding pad structure, depicting an electrically conductive first supporting layer configured as a sheet having slotted no voids, and an electrically conductive second supporting layer configured as a sheet having slotted voids in a second direction.
Figure 11:
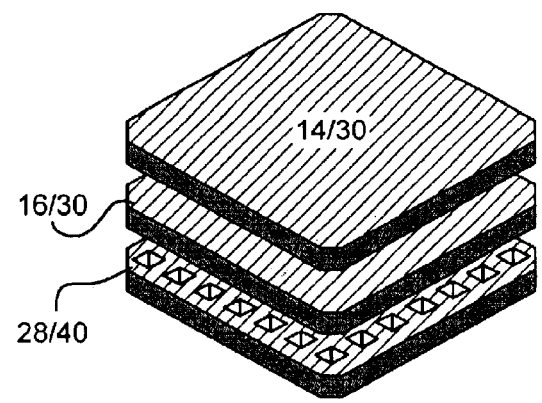
FIG. 11 is a partial exploded perspective view of a first embodiment of the bonding pad structure, depicting an electrically conductive first supporting layer configured as a sheet having slotted no voids, and an electrically conductive second supporting layer configured as a sheet having voids in a checkerboard pattern.

An electrically conductive second supporting layer 28 preferably underlies the first supporting layer 16. The second supporting layer 28 is also preferably formed of a metal or a metal alloy, and is most preferably copper. The second supporting layer 28 is, in various embodiments, preferably configured as one of a sheet 32 having slotted voids 34 oriented in a first direction as depicted in FIG. 3, a sheet 36 having slotted voids 38 oriented in a second direction as depicted in FIG. 4, or a sheet 40 having voids 42 in a checkerboard pattern as depicted in FIG. 5.

According to the present invention, the three layers described above, being the capping layer 14, the first supporting layer 16, and the second supporting layer 28, can be arranged in a variety of different configurations, a few of which are depicted in FIGS. 6–11, which are partial exploded perspective diagrams of the three layers 14, 16, and 28, and which do not show any of the other elements, layers, or structures which may be present, such as are depicted in part in FIG. 1. In each of the FIGS. 6–11, each of the three layers 14, 16, and 28 are labeled with two different reference numbers, separated by an oblique stroke. The first of the reference numbers identifies the layer, be it the capping layer 14, the first supporting layer 16, or the second supporting layer 28, and the second of the reference numbers identifies the configuration for that layer, be it a solid sheet 30 without voids, a sheet 32 having voids in the first direction, a sheet 36 having voids in the second direction, or a sheet 40 having voids in the checkerboard pattern.

As can be seen, the first and second supporting layers 16 and 28 can each have the configuration of a sheet 32 having slotted voids running in the first direction, being the same direction in each of the first and second supporting layers 16 and 28. Alternately, one of the layers 16 and 28 can have slotted voids running in the first direction, while the other of the layers 16 and 28 can have slotted voids running the second direction. As depicted, the first direction is perpendicular to the second direction, which is the preferred embodiment. However, in other embodiments, the first and second directions are merely different directions, which may be at any angle, one to the other.

In this manner, the first and second supporting layers 16 and 28 are sufficient to substantially absorb the forces applied to the bonding pad structure 12 during a wire bonding operation, and protect the underlying circuitry, such as the circuitry 11, from such forces. The first and second supporting layers 16 and 28 are preferably separated by an intervening layer 22 of a an electrically nonconductive material, which may be either a traditional dielectric such as a silicon oxide, or a low k material.

The circuitry 11 disposed below the bonding pad structure 12 is most preferably one or more input/output cell. In this manner, the bonding pad structure 12 overlies the input/output cell circuitry 11, and thus does not take additional surface area of the integrated circuit 10. This tends to reduce the size of the integrated circuit 10, which also tends to reduced the cost of the integrated circuit 10. The circuitry 11 below the bonding pad structure 12 is preferably formed of electrically conductive lines 18, which are most preferably formed of copper, and which are electrically insulated one from another and also from the second supporting layer 28 by a dielectric material 24, which is most preferably a low k material. Additional structures for the input/output cells are in the substrate 26, which as described above, preferably includes more layers and structures as depicted than just a semiconducting wafer.

Thus, bonding pad structures 12 according to various embodiments of the present invention allow for the bonding pad structures 12 to be placed over active circuitry 11, such as input/output cells, and for that active circuitry 11 to include fragile materials such as low k layers. Because the bonding pad structure 12 absorbs and redirects the forces applied during a wire bonding operation, the underlying circuitry 11 is not damaged, such as by cracking or delamination. Thus, the bonding pad structures 12 according to the present invention allow the integrated circuit 10 to be formed with the bonding pad structures 12 overlying input/output cells, which generally reduces both the size, and therefore the cost, or the integrated circuit 10.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A bonding pad structure, comprising:
   an electrically conductive capping layer,
   an electrically conductive first supporting layer disposed immediately under the electrically conductive capping layer, without any intervening layers between the electrically conductive capping layer and the electrically conductive first supporting layer, the electrically conductive first supporting layer configured as one of a sheet having no voids and a sheet having slotted voids in a first direction, and
   an electrically conductive second supporting layer disposed under the electrically conductive first supporting layer, the electrically conductive second supporting layer configured as one of a sheet having slotted voids in the first direction, a sheet having slotted voids in a second direction, and a sheet having checkerboard voids.

2. The bonding pad structure of claim 1, further comprising an electrically nonconductive layer disposed between the electrically conductive first supporting layer and the electrically conductive second supporting layer.

3. The bonding pad structure of claim 1, further comprising a low k layer disposed between the electrically conductive first supporting layer and the electrically conductive second supporting layer.

4. The bonding pad structure of claim 1, further comprising a silicon oxide layer disposed between the electrically conductive first supporting layer and the electrically conductive second supporting layer.

5. The bonding pad structure of claim 1, wherein the electrically conductive capping layer is formed of aluminum.

6. The bonding pad structure of claim 1, wherein the electrically conductive first supporting layer is formed of copper.

7. The bonding pad structure of claim 1, wherein the electrically conductive first supporting layer has a thickness of no less than about one micron.

8. The bonding pad structure of claim 1, wherein the electrically conductive second supporting layer is formed of copper.

9. The bonding pad structure of claim 1, wherein the first direction is perpendicular to the second direction.

10. The bonding pad structure of claim 1, wherein the electrically conductive first supporting layer is configured as a sheet having no voids, and the electrically conductive second supporting layer is configured as a sheet having slotted voids in the first direction.

11. The bonding pad structure of claim 1, wherein the electrically conductive first supporting layer is configured as a sheet having no voids, and the electrically conductive second supporting layer is configured as a sheet having slotted voids in a second direction.

12. The bonding pad structure of claim 1, wherein the electrically conductive first supporting layer is configured as a sheet having no voids, and the electrically conductive second supporting layer is configured as a sheet having checkerboard voids.

13. The bonding pad structure of claim 1, wherein the electrically conductive first supporting layer is configured as a sheet having slotted voids in a first direction, and the electrically conductive second supporting layer is configured as a sheet having slotted voids in the first direction.

14. The bonding pad structure of claim 1, wherein the electrically conductive first supporting layer is configured as a sheet having slotted voids in a first direction, and the electrically conductive second supporting layer is configured as a sheet having slotted voids in a second direction.

15. The bonding pad structure of claim 1, wherein the electrically conductive first supporting layer is configured as a sheet having slotted voids in a first direction, and the electrically conductive second supporting layer is configured as a sheet having checkerboard voids.

16. An integrated circuit having the bonding pad structure of claim 1.

17. The bonding pad structure of claim 1, further comprising an input/output cell disposed directly underneath and electrically connected to the bonding pad structure.

18. The bonding pad structure of claim 1, further comprising:
   electrically conductive third layers disposed under the electrically conductive second supporting layer, and
   low k layers electrically insulating the electrically conductive third layers from one another and from the electrically conductive second supporting layer.

19. A bonding pad structure, comprising:

an electrically conductive capping layer, an electrically conductive first supporting layer disposed immediately under the electrically conductive capping layer, without any intervening layers between the electrically conductive capping layer and the electrically conductive first supporting layer, the electrically conductive first supporting layer configured as a sheet having no voids, an electrically conductive second supporting layer disposed under the electrically conductive first supporting layer, the electrically conductive second supporting layer configured as one of a sheet having slotted voids in a first direction, a sheet having slotted voids in a second direction, and a sheet having checkerboard voids, and an electrically nonconductive layer disposed between the electrically conductive first supporting layer and the electrically conductive second supporting layer.

20. A bonding pad structure, comprising:

an electrically conductive capping layer, an electrically conductive first supporting layer disposed immediately under the electrically conductive capping layer, without any intervening layers between the electrically conductive capping layer and the electrically conductive first supporting layer, the electrically conductive first supporting layer configured as a sheet having slotted voids in a first direction, an electrically conductive second supporting layer disposed under the electrically conductive first supporting layer, the electrically conductive second supporting layer configured as one of a sheet having slotted voids in the first direction, a sheet having slotted voids in a second direction, and a sheet having checkerboard voids, and an electrically nonconductive layer disposed between the electrically conductive first supporting layer and the electrically conductive second supporting layer.

\* \* \* \* \*